(12) United States Patent
Torii

(10) Patent No.: US 7,531,419 B2
(45) Date of Patent: May 12, 2009

(54) SEMICONDUCTOR DEVICE AND A METHOD OF MANUFACTURING THE SAME

(75) Inventor: Katsuhiro Torii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 136 days.

(21) Appl. No.: 11/432,516

(22) Filed: May 12, 2006

(65) Prior Publication Data
US 2006/0255428 A1 Nov. 16, 2006

(30) Foreign Application Priority Data
May 13, 2005 (JP) .............................. 2005-141019

(51) Int. Cl.
*H01L 21/20* (2006.01)
(52) U.S. Cl. ...................... 438/396; 438/253; 438/387; 257/532
(58) Field of Classification Search ................. 257/532; 438/387, 396, 253
See application file for complete search history.

(56) References Cited

U.S. PATENT DOCUMENTS 6,180,976 B1 * 1/2001 Roy ............................ 257/306

2004/0099897 A1 5/2004 Tsutsue et al. .............. 257/303

FOREIGN PATENT DOCUMENTS

| JP | 2003-258107 | 9/2003 |
| JP | 2004-119461 | 4/2004 |
| JP | 2004-146814 | 5/2004 |
| JP | 2004-247520 | 9/2004 |
| JP | 2004-253481 | 9/2004 |

* cited by examiner

*Primary Examiner*—W. David Coleman
*Assistant Examiner*—Vicki B Booker
(74) *Attorney, Agent, or Firm*—Miles & Stockbridge P.C.

(57) ABSTRACT

A capacitor has an MIM (Metal Insulator Metal) structure comprising a lower electrode formed in the interior of an electrode trench which is formed in an interlayer insulating film, a dielectric film formed over the lower electrode, and an upper electrode formed over the dielectric film. The upper electrode and the dielectric film are each formed with an area larger than the area of the lower electrode so that the whole of the lower electrode is positioned inside the upper electrode and the dielectric film. The reliability and production yield of the capacitor are improved.

11 Claims, 18 Drawing Sheets

SEMICONDUCTOR DEVICE AND A METHOD OF MANUFACTURING THE SAME

CROSS-REFERENCE TO RELATED APPLICATION

The present invention claims priority from Japanese patent application No. 2005-141019 filed on May 13, 2005, the content of which is hereby incorporated by reference into this application.

BACKGROUND OF THE INVENTION

The present invention relates to a semiconductor device and a technique for manufacturing the same. Particularly, the present invention is concerned with a semiconductor device having a capacitor of MIM (Metal Insulator Metal) structure and a technique applicable effectively to a manufacturing technique for the semiconductor device.

In an LSI for communication and a high-speed CMOS logic device, it is essential to make the dielectric constant of an interlayer insulating film low and adopt Cu wiring with use of the Damascene method, as a technique for attaining a high-speed circuit operation. The LSI for communication and the CMOS logic device generally include a capacitor of MIM structure within an analog circuit.

The technique for fabricating a capacitor of MIM structure is described, for example, in Japanese Published Unexamined Patent Application No. 2004-146814 (Patent Literature 1), No. 2004-253481 (Patent Literature 2), No. 2004-247520 (Patent Literature 3), and No. 2004-119461 (Patent Literature 4). Among them, Patent Literature 1 discloses a technique for forming a lower electrode of a capacitor by the Damascene method.

[Patent Literatures]
1. Japanese Unexamined Patent Publication No. 2004-146814
2. Japanese Unexamined Patent Publication No. 2004-253481
3. Japanese Unexamined Patent Publication No. 2004-247520
4. Japanese Unexamined Patent Publication No. 2004-119461

SUMMARY OF THE INVENTION

FIG. 18 is a sectional view of a principal portion of a semiconductor substrate, showing a capacitor (C) of MIM structure which the present inventors have studied. In the same figure, the reference numeral 1 denotes a semiconductor substrate formed of a single crystal silicon, numeral 14 denotes a silicon oxide film, numeral 17 denotes an SiOC (carbonated silicon) film, and numerals 22 and 28 each denote an interlayer insulating film formed by an SiOC film. Further, numeral 19 denotes a first-layer wiring and numeral 26 denotes a second-layer wiring, each comprising a Cu film formed by the Damascene method.

The capacitor (C) is made up of a lower electrode 50 formed, for example, by a titanium nitride (TiN) film, a dielectric film 51 formed by a silicon nitride film, and an upper electrode 52 formed by a TiN film. The lower electrode 50 is connected electrically to the second-layer wiring 26 through a plug 53 formed in the interlayer insulating film 28. The upper electrode 52 is connected electrically to an upper-layer wiring (not shown).

The capacitor (C) is formed by depositing a TiN film, a silicon nitride film and a TiN film in order onto the interlayer insulating film 28 and thereafter dry-etching the TiN film, silicon nitride film and TiN film in order with use of a photoresist film as a mask.

However, in case of dry-etching the three-layer films (TiN film, silicon nitride film and TiN film) in order through the photoresist film as a mask as described above, a polymer containing an etching residue of the electrode material (TiN) adheres to side walls of the capacitor (C). It turned out from studies made by the present inventors that the occurrence of a short circuit between the upper electrode 52 and the lower electrode 50 through the said polymer was unavoidable.

As a countermeasure, for example, it may be effective to perform the dry etching for the three-layer of films (TiN film, silicon nitride film, and TiN film) dividedly two times to differentiate the size of the lower electrode 50 and that of the upper electrode 52. By so doing, even if the polymer containing an etching residue of the electrode material adheres to side walls of the upper and lower electrodes 52, 50, both electrodes becomes difficult to short because their side walls are spaced away from each other.

For example, in Patent Literatures 2 and 3 referred to above, an upper electrode and a dielectric film are formed by dry etching with use of a first photoresist film and thereafter a lower electrode is formed by dry etching with use of a second photoresist film, whereby the size of the lower electrode is made larger than the size of the upper electrode and that of the dielectric film.

In Patent Literature 4 referred to above, a lower electrode is formed by dry etching with use of a first photoresist film and thereafter an upper electrode and a dielectric film are formed with use of a second photoresist film, whereby the size of the lower electrode is made larger than the size of the upper electrode and that of the dielectric film.

However, in the above methods wherein dry etching is performed using two types of photoresist films different in size, there arises the problem that the number of photomasks increases and the process becomes complicated. Besides, even if the size of the lower electrode and that of the upper electrode are made different, it is difficult to prevent shorting of the two positively because the polymer remains on the respective side walls.

It is an object of the present invention to provide a technique able to positively prevent the occurrence of a short circuit between upper and lower electrodes of a capacitor having an MIM structure.

The above and other objects and novel features of the present invention will become apparent from the following description and the accompanying drawings.

The following is an outline of typical modes of the present invention as disclosed herein.

A semiconductor device according to the present invention includes a capacitor, the capacitor comprising a first electrode, a dielectric film formed on the first electrode, and a second electrode formed on the dielectric film, the first electrode being constituted by a first conductive film buried in the interior of a trench formed in an insulating film on a semiconductor substrate, the area of the dielectric film and that of the second electrode being equal to each other and being each larger than the area of the first electrode.

A method according to the present invention is for manufacturing a semiconductor device including a capacitor, the capacitor comprising a first electrode, a dielectric film formed on the first electrode, and a second electrode formed on the dielectric film, and comprises the steps of (a) forming a trench in an insulating film on a semiconductor substrate, (b) forming a first conductive film on the insulating film including the interior of the trench, thereafter removing the first conductive film present outside the trench by a chemical mechanical polishing method, allowing the first conductive film to remain in the interior of the trench, to form the first electrode in the interior of the trench, (c) forming the dielectric film on the insulating film including an upper portion of the first electrode and forming a second conductive film on the dielectric film, and (d) dry-etching the second conductive film and the dielectric film with use of a photoresist film as a mask, thereby allowing the dielectric film having an area larger than that of the first electrode to remain on the first electrode, and forming on the dielectric film the second electrode constituted by the second conductive film and having an area larger than that of the first electrode.

The following is a brief description of an effect obtained by the typical modes of the present invention as disclosed herein.

By forming the first electrode of the capacitor within a trench formed in the insulating film and forming on top of the first electrode a dielectric film and a second electrode each larger in area than the first electrode, it is possible to positively prevent the occurrence of a short circuit between the first and second electrodes.

DETAILED DESCRIPTION OF PREFERRED EMBODIMENTS

Figure 1:
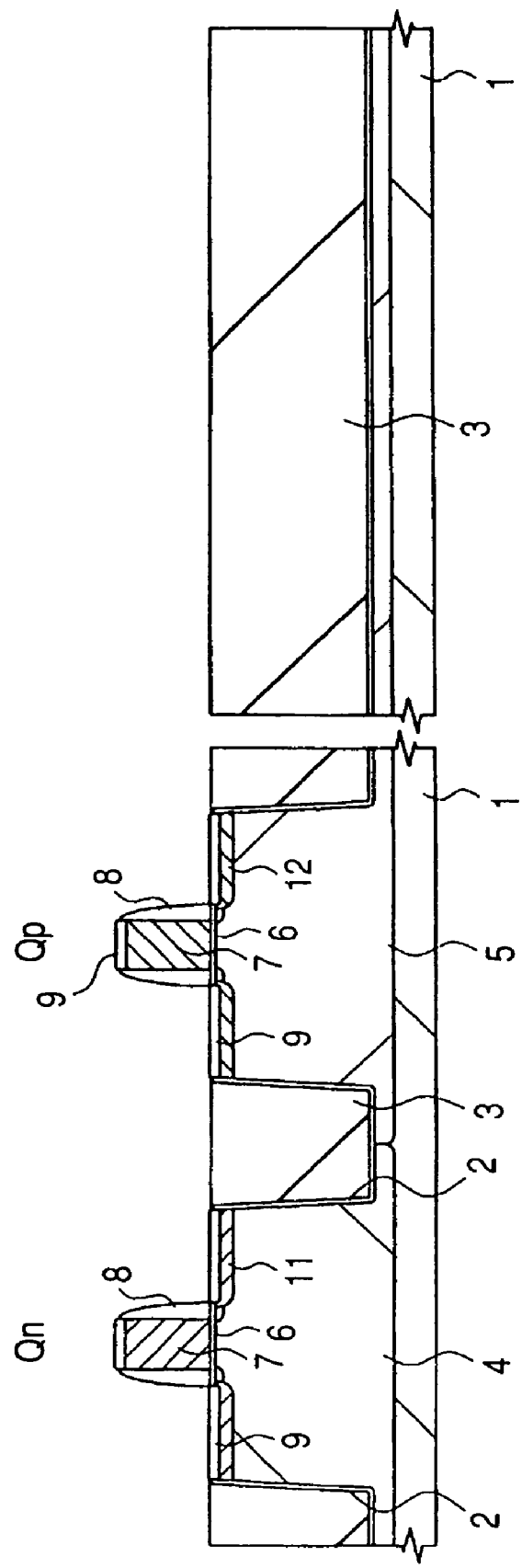
FIG. 1 is a sectional view of principal portions of a semiconductor substrate, showing a semiconductor device manufacturing method according to an embodiment of the present invention.

Embodiments of the present invention will be described in detail hereinunder with reference to the accompanying drawings. In all of the drawings for explaining the embodiments, the same members are identified by the same reference numerals in principle, and repeated explanations thereof will be omitted.

An embodiment of the present invention to be described below is concerned with a CMOS-LSI having a three-layer wiring and a capacitor of MIM structure. A method of manufacturing the CMOS-LSI will be described below step by step with reference to FIGS. 1 to 12.

First, as shown in FIG. 1, for example, an n-channel MISFET (Qn) and a p-channel MISFET (Qp) are formed on a main surface of a semiconductor substrate (hereinafter referred to simply as the "substrate") which is formed of a single crystal silicon. In the same figure, the left portion is a MISFET forming region and the right portion is a capacitor forming portion; further, the numeral 2 denotes an element isolation region, numeral 4 denotes a p-type well, and numeral 5 denotes an n-type well. The element isolation trench 2 is formed by burying, for example, a silicon oxide film 3 as an insulating film into a trench formed by etching the substrate 1. The p-type well 4 and the n-type well 5 are formed by ion-implantation of a p-type impurity (boron) and an n-type impurity (phosphorus) into the substrate 1 and subsequent heat treatment of the substrate 1 to diffuse the impurities into the substrate.

The n-channel MISFET (Qn) is made up of a gate insulating film 6 formed by a silicon oxide film or a silicon oxynitride film on a surface of the p-type well 4, a gate electrode 7 formed by a polycrystalline silicon film on top of the gate insulating film 6, side wall spacers 8 formed by a silicon oxide film on side walls of the gate electrode 7, and a pair of n-type semiconductor regions (source and drain) 11 formed in the p-type well 4 on both sides of the gate electrode 7. The p-channel MISFET (Qp) is made up of a gate insulating film 6, a gate electrode 7, side wall spacers 8, and a pair of p-type semiconductor regions (source and drain) 12 formed in the n-type well 5 on both sides of the gate electrode 7. An n-type impurity (phosphorus) is introduced into the polycrystalline silicon film which constitutes the gate electrode 7 of the n-channel MISFET (Qn), while a p-type impurity (boron) is introduced into the polycrystalline silicon film which constitutes the gate electrode 7 of the p-channel MISFET (Qp). A Co (cobalt) silicide film 9 is formed on each of the surfaces of the gate electrode 7 and n-type semiconductor regions (source and drain) 11 in the n-channel MISFET (Qn) and surfaces of the gate electrode 7 and p-type semiconductor regions (source and drain) 12 in the p-channel MISFET (Qp) for the purpose of attaining a low resistance of the gate electrodes 7 and the sources and drains.

Figure 2:
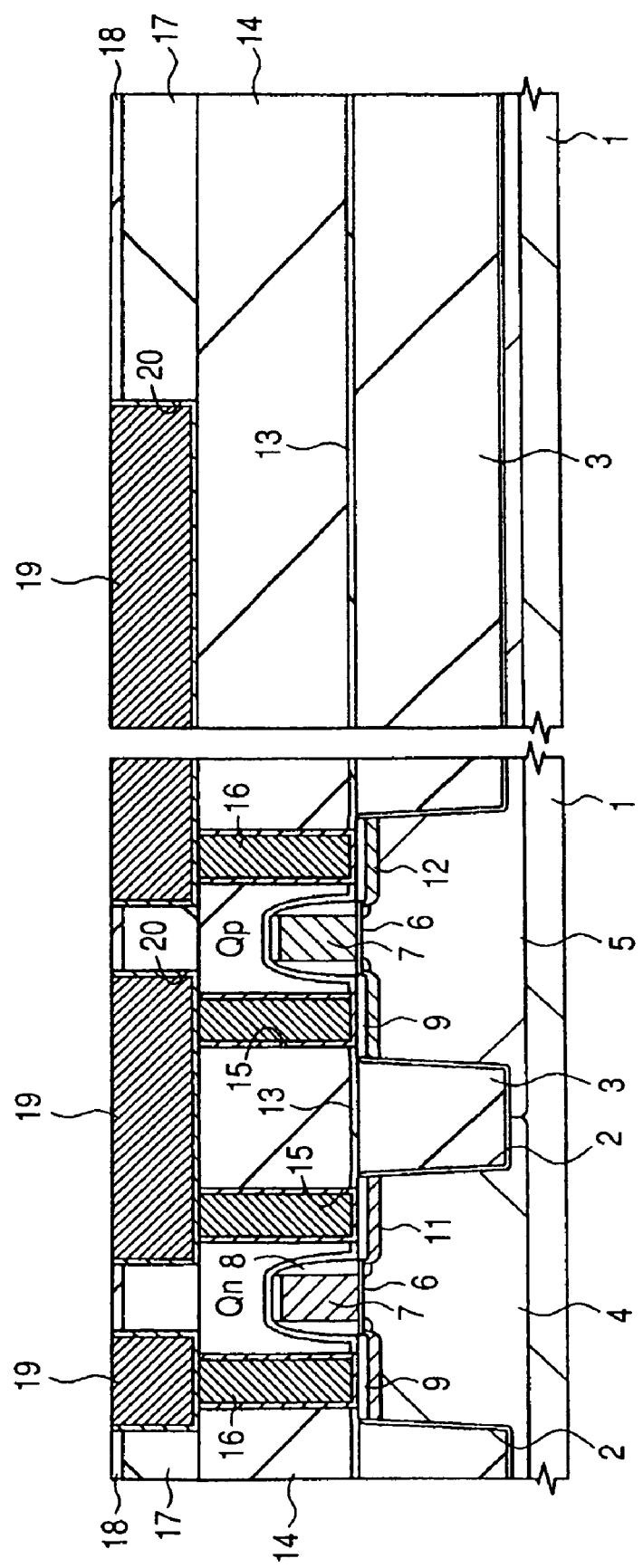
FIG. 2 is a sectional view of principal portions of the semiconductor substrate, showing a semiconductor device manufacturing step which follows FIG. 1.

Next, as shown in FIG. 2, plugs 16 and a first-layer wiring 19 are formed above the n-channel MISFET (Qn) and the p-channel MISFET (Qn) and the n- and p-channel MISFETs (Qn), (Qp) and the first-layer wiring 19 are connected together electrically through the plugs 16.

The first-layer wiring 19 is formed in the following manner. First, a silicon nitride film 13 as an etching stopper film and a silicon oxide film 14 as an insulating film are deposited on the substrate 1 by CVD and thereafter the surface of the silicon oxide film 14 is planarized by a chemical mechanical polishing method. Subsequently, the silicon oxide film 14 and the silicon nitride film 13 on the n-type semiconductor regions (source and drain) 11 of the n-channel MISFET (Qn) and the p-type semiconductor regions (source and drain) 12 of the p-channel MISFET (Qp) are etched to form contact holes 15. Thereafter, a plug 16 is formed in the interior of each contact hole 15. For example, the plug 16 is formed by a laminate of both TiN (titanium nitride) film and W (tungsten) film. The TiN film functions as a barrier metal film of W film and may be substituted by a laminate of TiN film and Ti (titanium) film.

Next, for example, an SiOC (carbonated silicon) film 17 as an insulating film 17, and for example, a silicon oxide film 18 as a cap insulating film 18 are deposited on the silicon oxide film 14 by CVD. Thereafter, using a photoresist film (not shown) as a mask, the cap insulating film 18 and the SiOC film 17 are dry-etched to form a wiring trench 20 on the silicon oxide film 14 and expose the plugs 16 to the bottom of the wiring trench 20.

Then, a thin (about 50 nm) TiN film or laminate of both TiN film and Ti film is deposited as a barrier metal film in the interior of the wiring trench 20 by sputtering, then a thick (about 800 to 1600 nm) Cu film is deposited by sputtering or plating in the interior of the wiring trench 20 to fill up the trench interior completely. Thereafter, the Cu film and barrier metal film present outside the wiring trench 20 are removed by a chemical mechanical polishing method. Through the steps so far performed, a first-layer wiring 19 constituted by a laminate of both barrier metal film and Cu film is formed in the interior of the wiring trench 20. The barrier metal film such as TiN film functions as a barrier film for preventing the Cu film from being diffused into the surrounding insulating film. As the barrier film there may be used not only the TiN film but also any of various conductive films difficult to react with Cu such as, for example, metal nitride films, e.g., WN (tungsten nitride) film and TaN (tantalum nitride) film, films formed by adding Si to those metal nitride films, refractory metal films, e.g., Ta film, Ti film, W film, and TiW film, and laminates of those refractory metal films.

Figure 3:
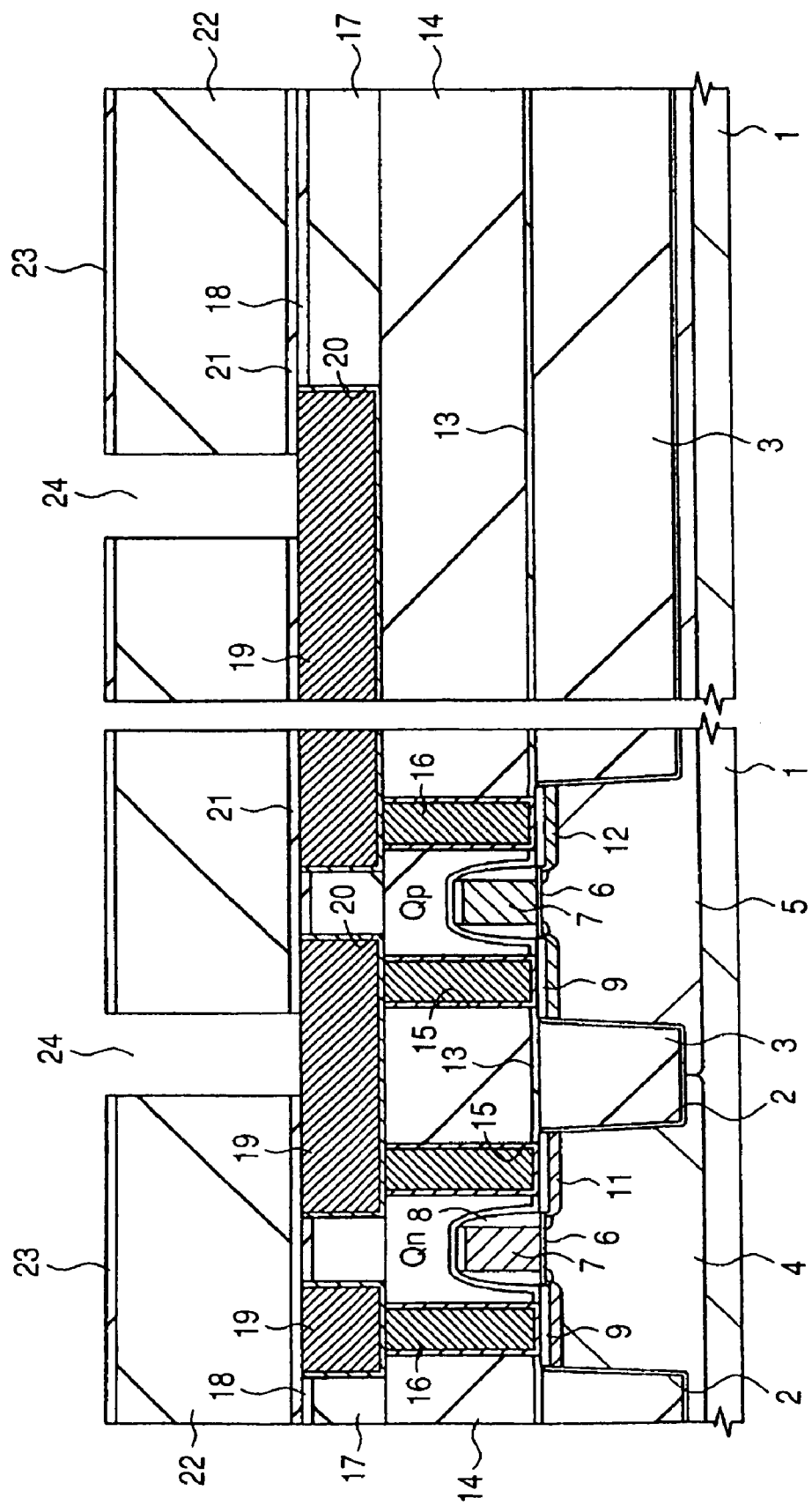
FIG. 3 is a sectional view of principal portions of the semiconductor substrate, showing a semiconductor device manufacturing step which follows FIG. 2.

Next, as shown in FIG. 3, a barrier insulating film. 21, an interlayer insulating film 22 and a cap insulating film 23 are deposited on the first-layer wiring 19. The barrier insulating film 21 is for preventing Cu contained in the first-layer wiring 19 from being diffused into the interlayer insulating film 22. For example, the barrier insulating film 21 is constituted by an SiC (silicon carbide) film or SiCN (silicon carbonitride) film of about 10 to 100 nm in thickness deposited by CVD. The interlayer insulating film 22 is constituted by an insulating film low in dielectric constant, e.g., SiOC film, for diminishing a capacitance formed between the first-layer wiring 19 and a second-layer wiring (26) which is formed over the first-layer wiring 19 in a subsequent step. The SiOC film is deposited to a thickness of about 460 nm by CVD. The cap insulating film 23 is for protecting the interlayer insulating film 22 at the time of forming Cu wiring by chemical mechanical polishing, the interlayer insulating film 22 being formed by the SiOC film which is lower in mechanical strength than the silicon oxide film. For example, the cap insulating film 23 is formed by a silicon oxide film of about 50 nm in thickness deposited by CVD.

Then, using a photoresist film as a mask, the cap insulating film 23, interlayer insulating film 22 and barrier insulating film are dry-etched to form a via hole 24 above the silicon oxide film 14 and expose the first-layer wiring 19 to the bottom of the via hole 24.

Figure 4:
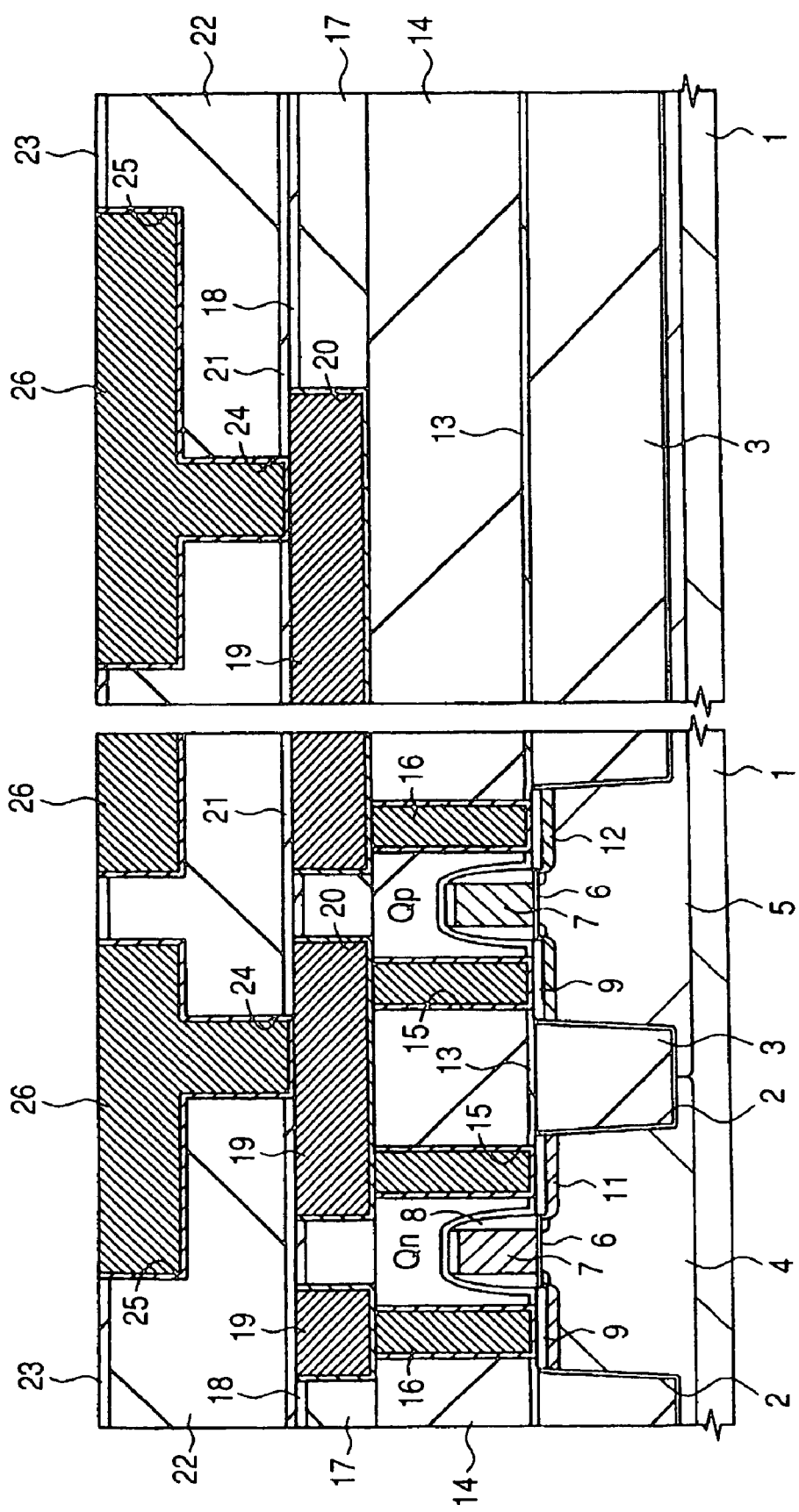
FIG. 4 is a sectional view of principal portions of the semiconductor substrate, showing a semiconductor device manufacturing step which follows FIG. 3.

Next, as shown in FIG. 4, the cap insulating film 23 and the interlayer insulating film 22 are dry-etched through a photoresist film as a mask to form a wiring trench 25 above the via hole 24. Subsequently, a second-layer wiring 26 is formed within the wiring trench 25 and the via hole 24. For forming the second-layer wiring 26, first a thin TiN film of about 50 nm in thickness is deposited as a barrier metal film into the wiring trench 25 and the via hole 24 by sputtering. Then, a Cu film thick enough to completely fill up the interior of the wiring trench 25 and that of the via hole 24 is deposited by sputtering or plating and thereafter the Cu film and barrier metal film present outside the wiring trench 25 are removed by chemical mechanical polishing.

Figure 5:
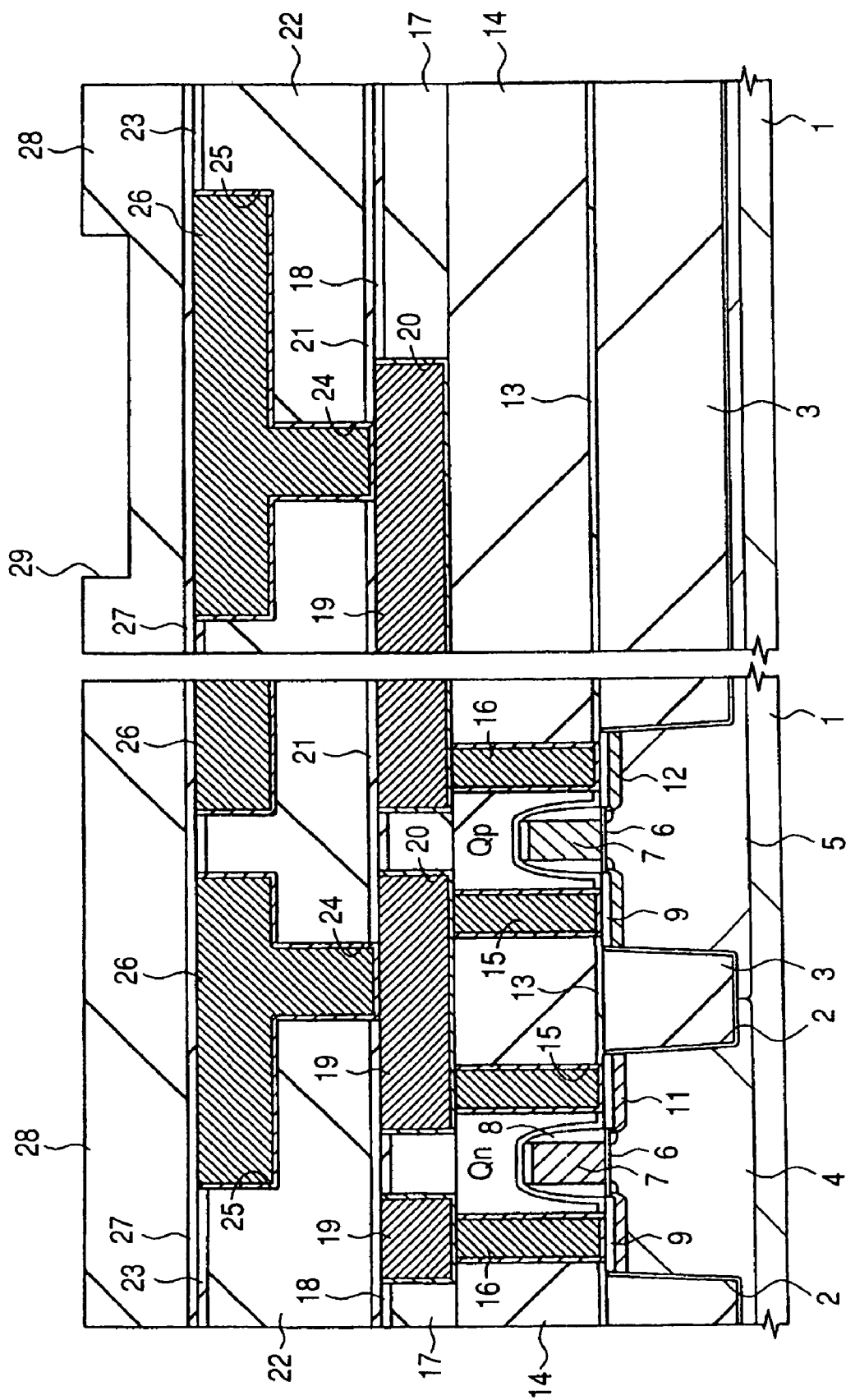
FIG. 5 is a sectional view of principal portions of the semiconductor substrate, showing a semiconductor device manufacturing step which follows FIG. 4.

Then, as shown in FIG. 5, a barrier insulating film 27 and an interlayer insulating film 28 are deposited over the second-layer wiring 26. For example, the barrier insulating film 27 is constituted by an SiC film or SiCN film of about 10 to 100 nm in thickness deposited by plasma CVD, and the interlayer insulating film 28 is constituted by a silicon oxide film of about 400 to 1000 nm in thickness deposited by plasma CVD. Subsequently, the interlayer insulating film 28 in the capacitor forming region is dry-etched through a photoresist film as a mask to form an electrode trench 29. The depth of the electrode trench 29 is, say, about 200 nm.

Figure 6:
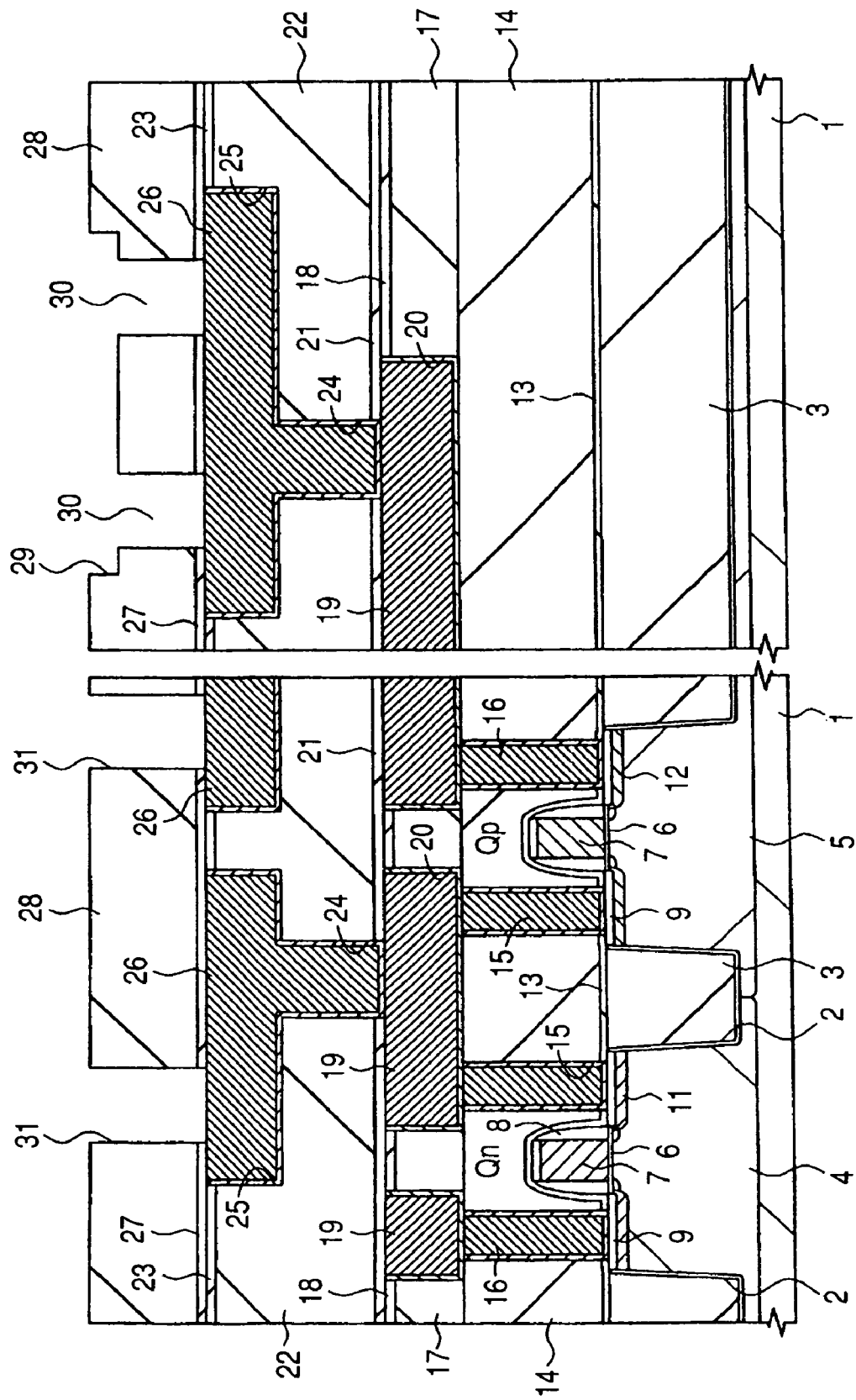
FIG. 6 is a sectional view of principal portions of the semiconductor substrate, showing a semiconductor device manufacturing step which follows FIG. 5.

Next, as shown in FIG. 6, the interlayer insulating film 28 present at the bottom of the electrode trench 29 and the underlying barrier insulating film 27 are dry-etched through a photoresist film as a mask to form via holes 30 reaching the second-layer wiring 26. At the same time, the interlayer insulating film 28 and the barrier insulating film 27 in the MISFET forming region are also dry-etched to form via holes 31 reaching the second-layer wiring 26. The electrode trench 29 and the via holes 30, 31 may be formed in accordance with a sequence reverse to the above sequence. That is, the electrode trench 29 may be formed after formation of the via holes 30 and 31.

Figure 7:
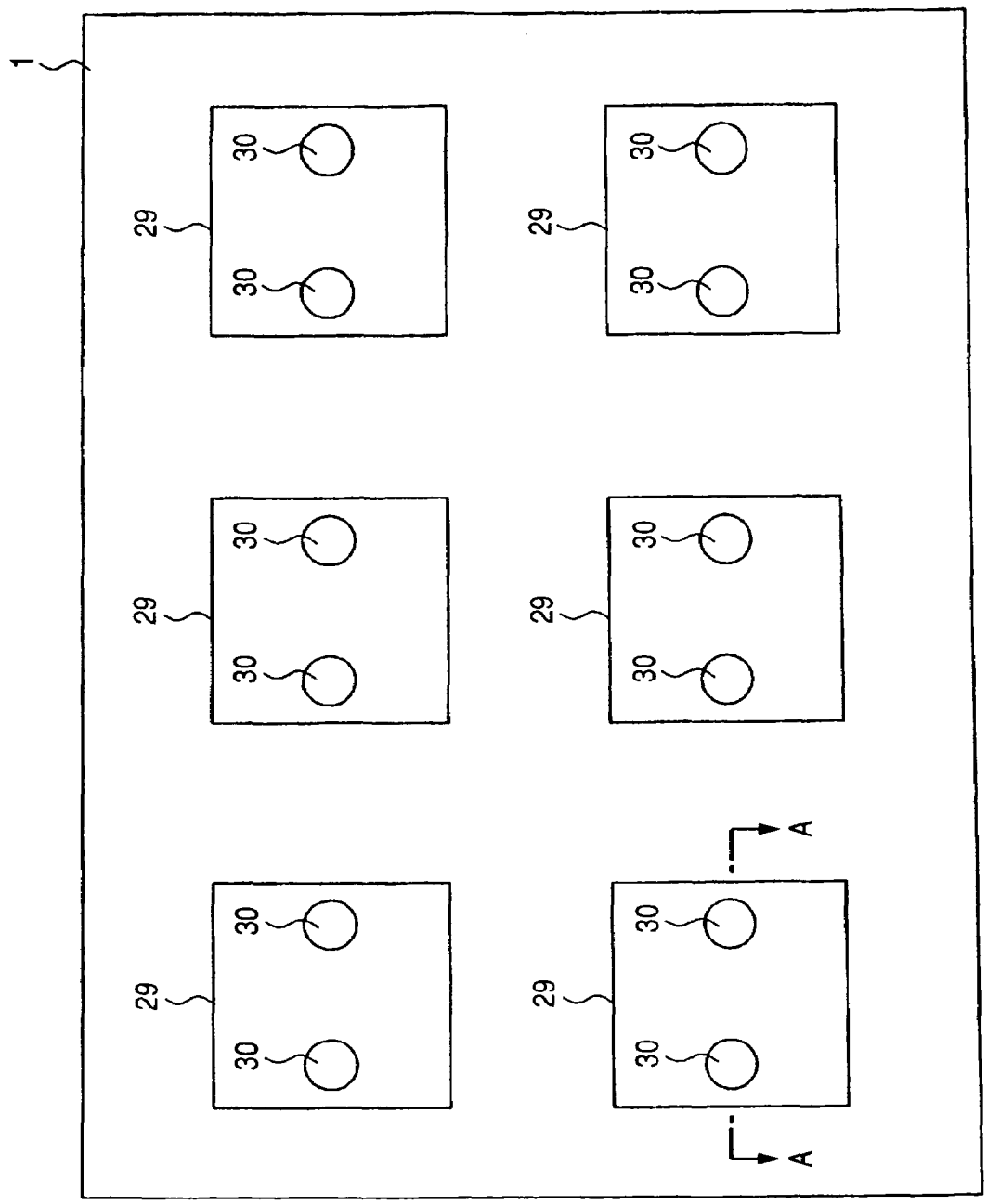
FIG. 7 is a plan view of principal portions, showing planar patterns of electrode trenches and via holes formed on the semiconductor substrate.

FIG. 7 shows planar patterns of the electrode trench 29 and via holes 30 formed in the capacitor forming region. A sectional view taken along the line A-A in the same figure corresponds to the right portion (capacitor forming region) in FIG. 6. As shown in FIG. 7, for example, six electrode trenches 29 are formed in the capacitor forming region.

A planar shape of each electrode trench 29 is, for example, a square shape with the lengths of each side to be about 3 μm.

Figure 8:
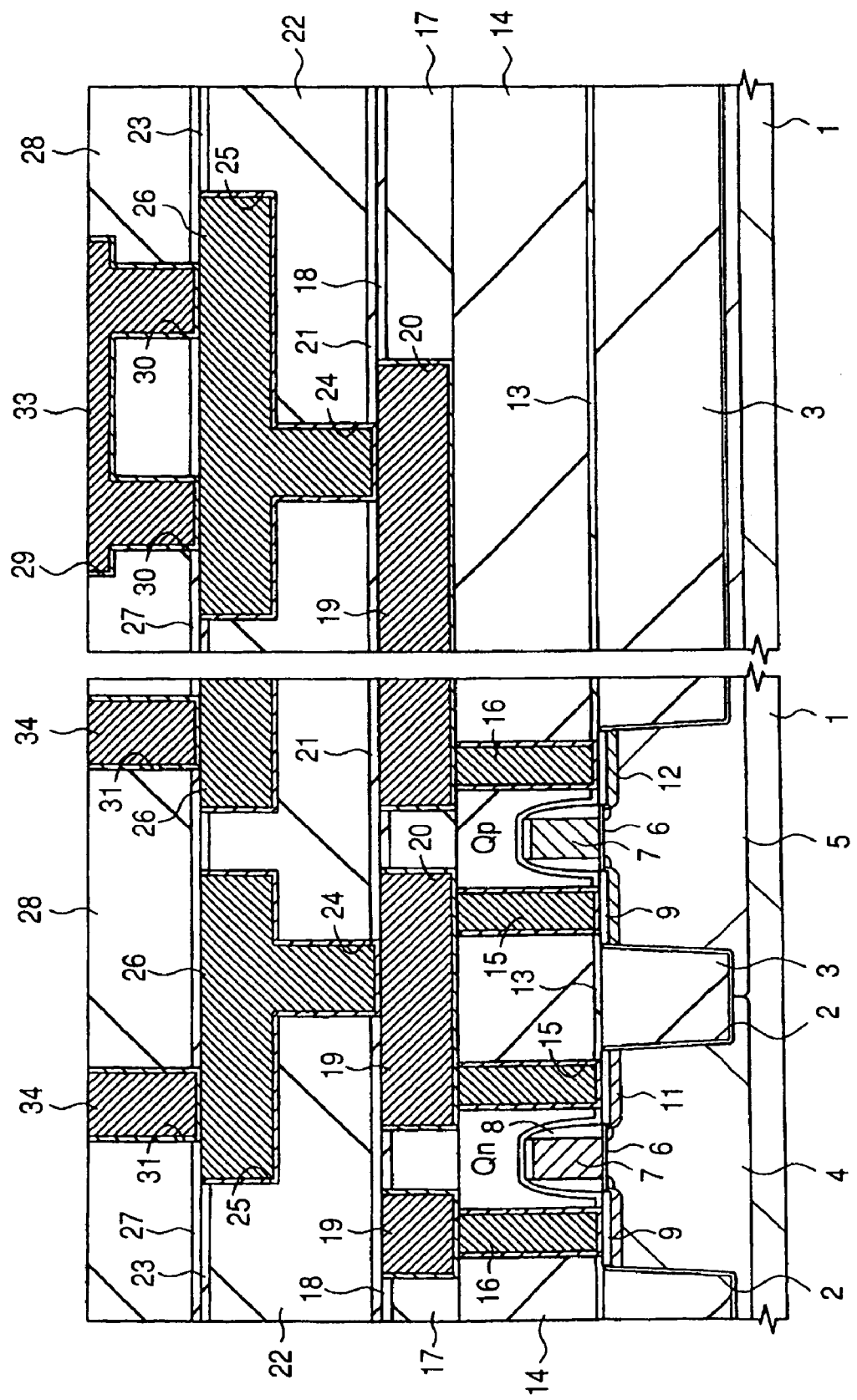
FIG. 8 is a sectional view of principal portions of the semiconductor substrate, showing a semiconductor device manufacturing step which follows FIG. 6.

Then, as shown in FIG. 8, a lower electrode (first electrode) 33 of a capacitor (C) is formed in the interior of each electrode trench 29. The lower electrode 33 is formed by the same method as that for the second-layer wiring 26. That is, a thin TiN film or a laminate of both TiN film and Ti film is formed in the interior of the electrode trench 29 and each of the via holes 30 by sputtering and subsequently a W film thick enough to completely fill up the interior of the electrode trench 29 and that of the via hole 30 is deposited by CVD. Thereafter, the W film and TiN film present outside the electrode trench 29 are removed by chemical mechanical polishing. At this time, a plug 34 comprising TiN film (or a laminate of both TiN film and Ti film) and W film is formed within each via hole 31 in the MISFET forming region. The lower electrode 33 formed in the interior of the electrode trench 29 is connected electrically to the second-layer wiring 26 through the via hole 30 which underlies the electrode trench 29. The plugs 34 formed in the MISFET forming region are each connected electrically to the underlying second-layer wiring 26.

The number and size of the electrode trenches in each of which the lower electrode 33 is buried is changed appropriately in the stage of design according to a desired capacitance value of the capacitor (C). At this time, if the size of each electrode trench 29 is set large, then when the surface of W film buried in the interior of the electrode trench 29 is polished by chemical mechanical polishing, there arises a marked erosion phenomenon such that W film present at the center of the trench 29 is polished to excess in comparison with the surrounding W film. Consequently, in an extreme case, the W film present at the center of the trench 29 is lost and the area of the lower electrode 33 decreases, with a consequent likelihood that the capacitance value of the capacitor (C) may become smaller than its design value. On the other hand, if the size of each electrode trench 29 is made too small, there occur marked variations in size among the electrode trenches 29. Consequently, there also occur variations in area among the lower electrodes 33 and hence the capacitance value of the capacitor (C) becomes different from its design value.

Therefore, it is preferable to optimize the size of each electrode trench 29 lest the above erosion phenomenon and variations in capacitance value should become marked. According to a study made by the present inventors, the area of each electrode trench 29 was preferably 1 to 25 $\mu m^2$, more preferably 4 to 16 $\mu m^2$. That is, by setting the area of each electrode trench 29 with the lower electrode 33 formed therein to a value falling under the above range, it was possible to fabricate a capacitor (C) having a capacitance value substantially equal to the design value.

In this embodiment the electrode trenches 29 for forming the lower electrodes 29 and the via holes 30 are formed separately. This is for the following reason. If the step for forming the electrode trenches 29 is omitted and the diameter of each via hole 30 is set equal to the size (the aforesaid 1 to 25 $\mu m^2$) of each electrode trench 29, the W film buried into the via hole 30 becomes fairly thick. As a result, when the W film present outside the via hole 30 is polished by chemical mechanical polishing, there occurs a polishing residue because of a too large polishing quantity of the W film and it becomes impossible to keep the film thickness uniform. As another problem, if the W film thickness is too large, the surrounding wiring may be affected by a stress induced from the W film. In this case, a crack is apt to be developed in the wiring and a defect such as wire breaking results. Therefore, to prevent the film thickness of the lower electrode from becoming too large, the electrode trench 29 and the via hole 30 are formed separately in this embodiment.

Figure 9:
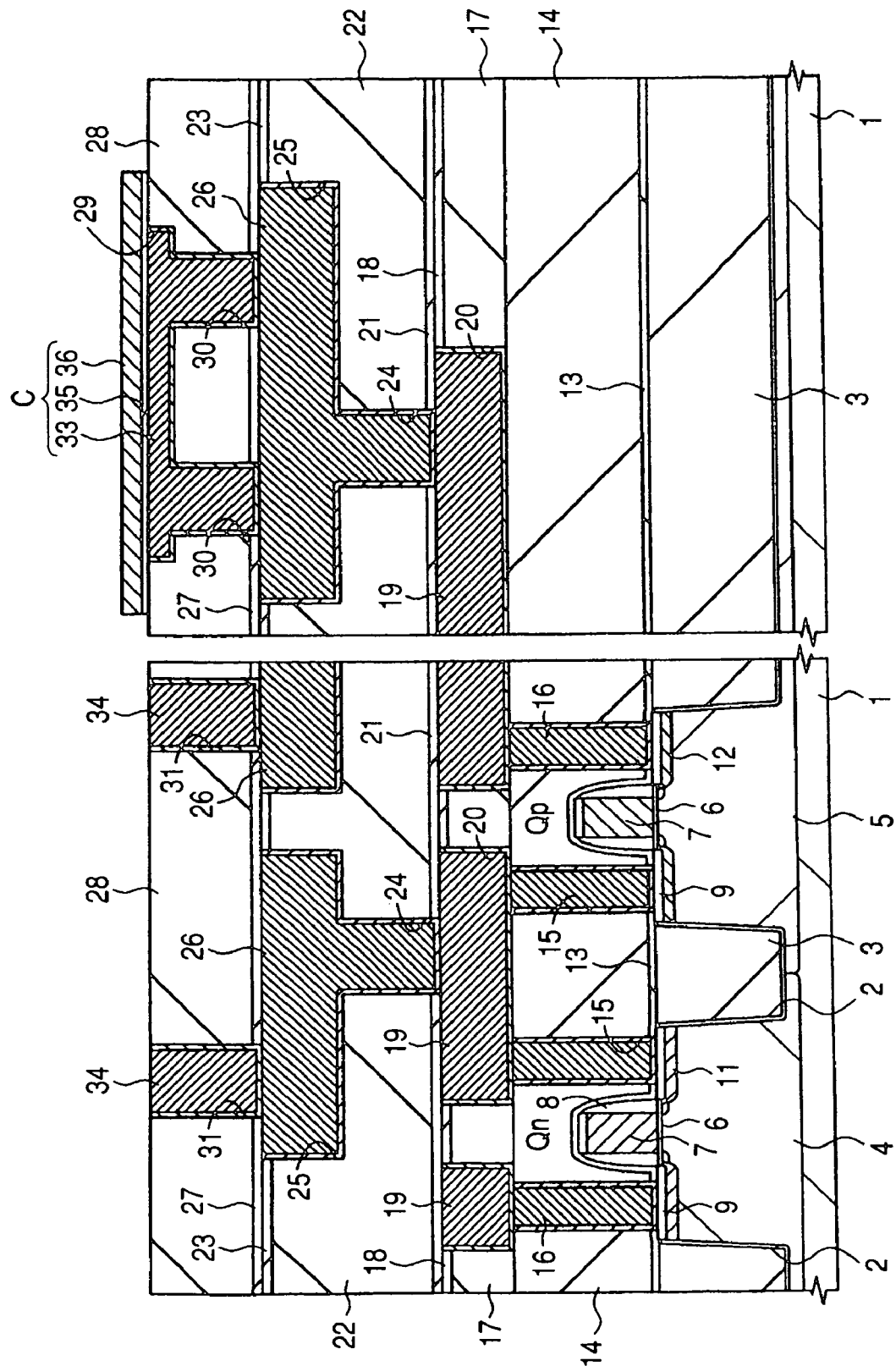
FIG. 9 is a sectional view of principal portions of the semiconductor substrate, showing a semiconductor device manufacturing step which follows FIG. 8.
Figure 10:
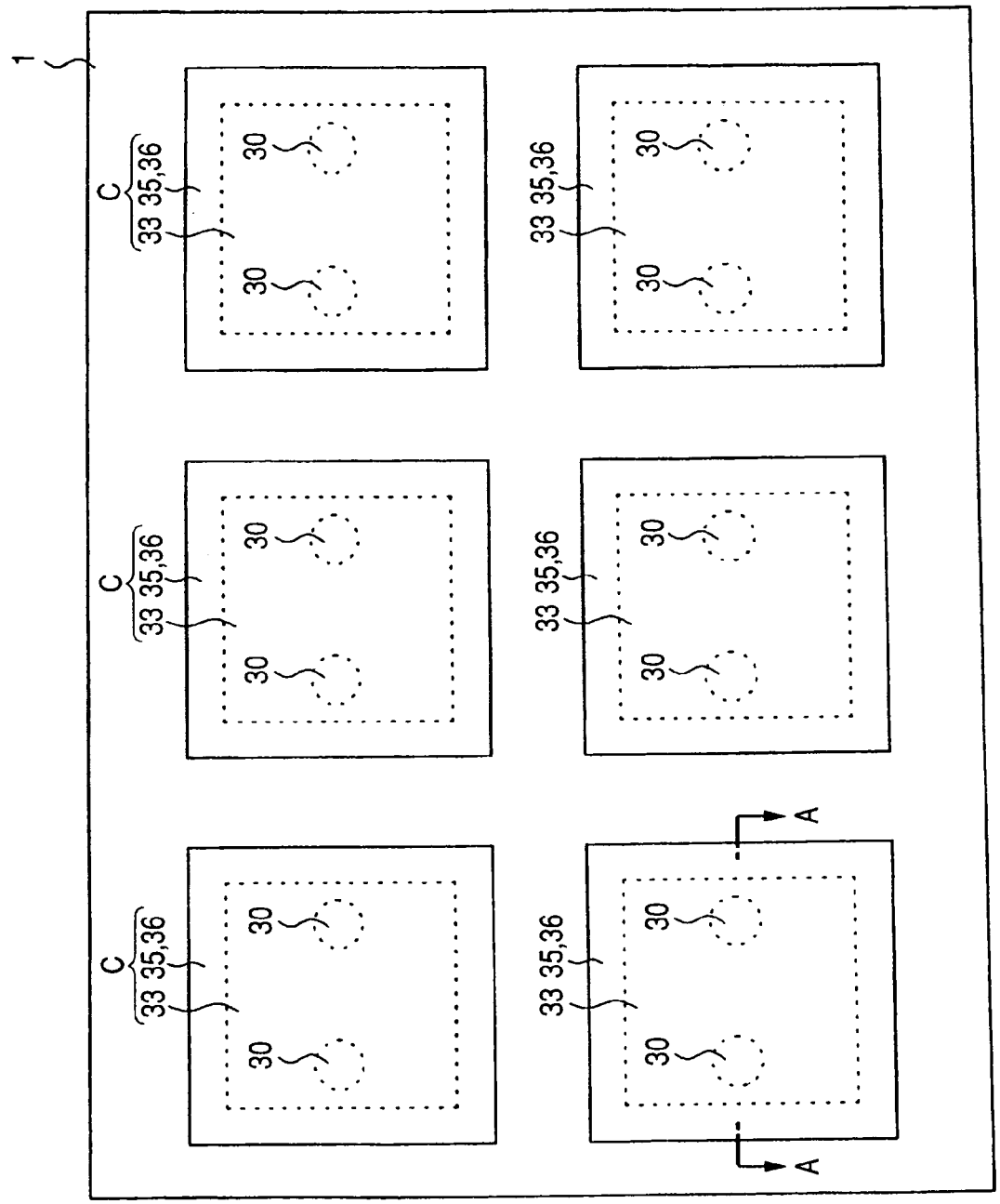
FIG. 10 is a plan view of principal portions, showing planar patterns of capacitors formed on the semiconductor substrate.

Next, as shown in FIG. 9, a dielectric film 35 and an upper electrode (second electrode) 36 are formed on the lower electrode 33. For forming the dielectric film 35 and the upper electrode 36, first, for example, a silicon nitride film of about 50 nm in thickness is deposited as a dielectric film 35 of a capacitor by CVD onto the interlayer insulating film 28 including the upper surfaces of plugs 34 and then a TiN film of about 50 nm in thickness is deposited as an upper electrode 36 of the capacitor by sputtering onto the silicon nitride film. Subsequently, using a photoresist film as a mask, the TiN film and the silicon nitride film are dry-etched to let the TiN film and the silicon nitride film remain on the lower electrode 33. Through the steps so far performed there is completed a capacitor (C) comprising the lower electrode 33 formed by W film, the dielectric film 35 formed by silicon nitride film and the upper electrode 36 formed by TiN film. FIG. 10 shows planar patterns of the capacitors (C), and a sectional view taken along the line A-A in the same figure corresponds to the right portion in FIG. 9.

As shown in FIGS. 9 and 10, the upper electrode 36 and the dielectric film 35 are each larger in area than the lower electrode 33 and the whole of the lower electrode 33 is disposed inside the upper electrode 36 and the dielectric film 35. By so doing, when the TiN film and the silicon nitride film are dry-etched through a photoresist film as a mask, the surface and side walls of the lower electrode 33 are not exposed to the lower portions of side walls of the upper electrode 36 and the dielectric film 35. Therefore, even if a polymer containing an etching residue of the upper electrode material (TiN) adheres to side walls of the upper electrode 36 and the dielectric film 35 at the time of dry etching, the upper electrode 36 and the lower electrode 33 can be positively prevented from being shorted through the said polymer.

According to the above method for fabricating the capacitor (C), since the dielectric film 35 is formed on the lower electrode 33 whose surface has been planarized by chemical mechanical polishing, the uniformity in thickness of the dielectric film 35 is improved, with the result that the reliability of the capacitor (C) is improved.

The dielectric film 35 is not limited to the silicon nitride film, but may be constituted by a silicon oxide film or a refractory metal oxide film (e.g., $Ta_2O_5$ film) higher in dielectric constant than the silicon nitride film. Further, the upper electrode 36 is not limited to the TiN film, but may be constituted, for example, by a metal nitride film as TaN film or such a refractory metal film as W film.

Figure 11:
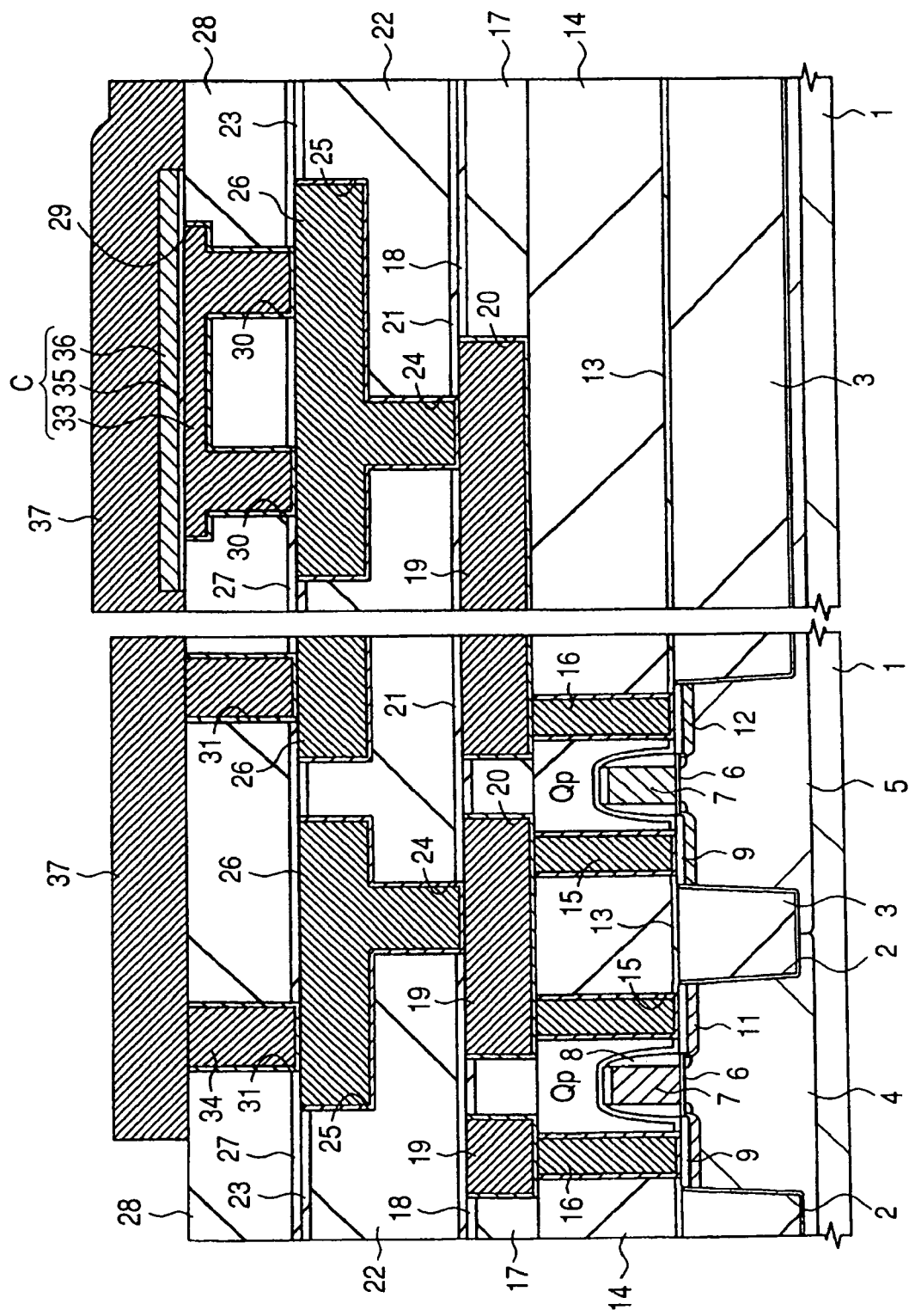
FIG. 11 is a sectional view of principal portions of the semiconductor substrate, showing a semiconductor device manufacturing step which follows FIG. 9.
Figure 12:
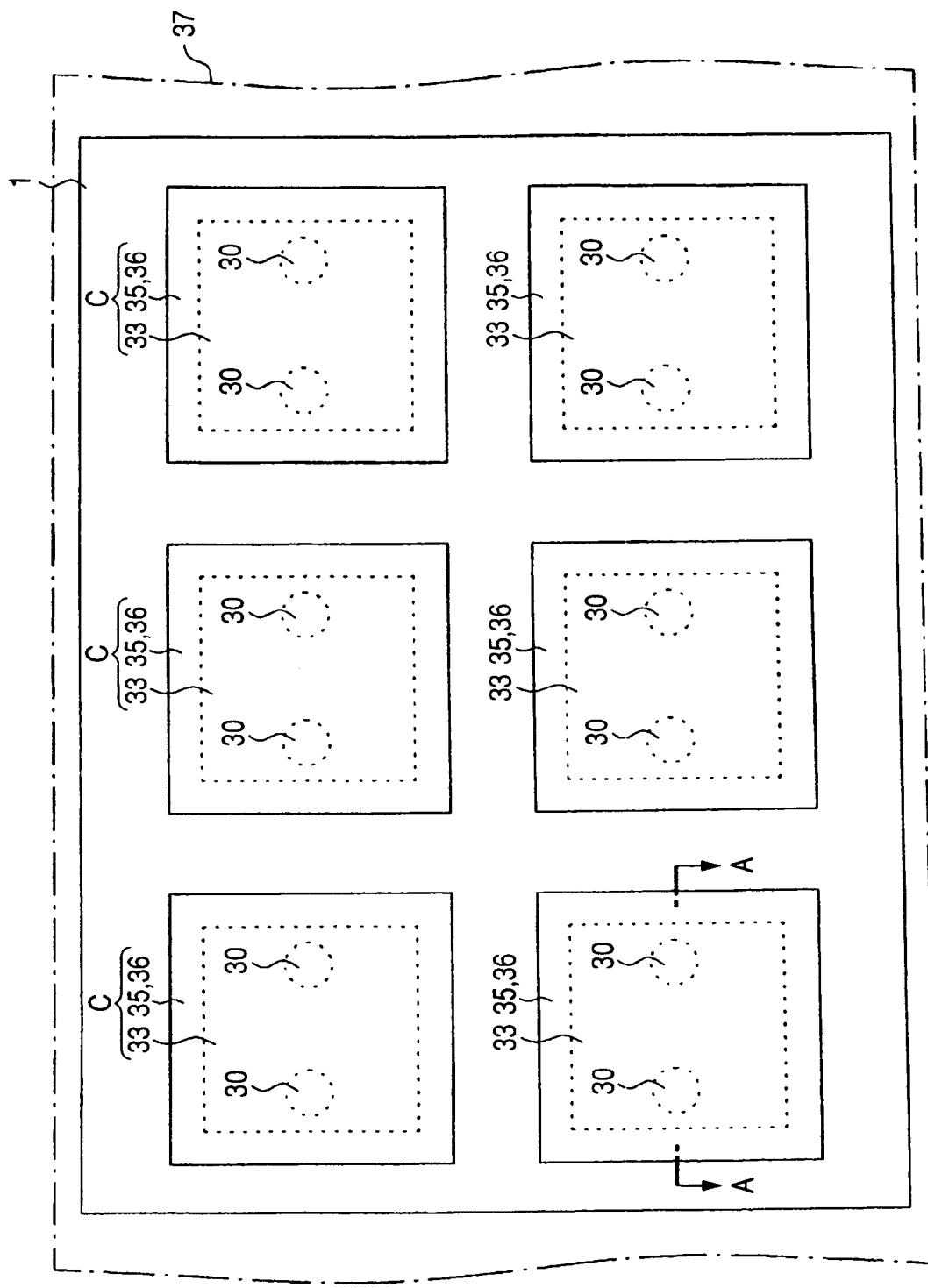
FIG. 12 is a plan view of principal portions of the semiconductor substrate, showing a semiconductor device manufacturing step which follows FIG. 9.

Next, as shown in FIGS. 11 and 12, a third-layer wiring 37 as a top layer is formed on the upper electrode 36. For forming the third-layer wiring 37, an Al (aluminum) alloy film is deposited by sputtering onto the interlayer insulating film 28 including the upper electrode 36 and the upper surfaces of the plugs 34 and is thereafter dry-etched using a photoresist film as a mask. The third-layer wiring 37 formed in the MISFET forming region is connected electrically to the second-layer wiring 26 through the plugs 34. A part of the third-layer wiring 37 formed in the MISFET forming region constitutes bonding pads.

According to the above structure of the capacitor (C), since the lower electrode 33 is formed in the interior of the electrode trench 29 and the surface thereof is covered with the dielectric film 35 whose area is larger than that of the lower electrode 33, there is no fear of a short circuit between the third-layer wiring 37 and the lower electrode 33 even if the third-layer wiring 37 is formed directly on top of the upper electrode 36. That is, the step of forming an insulating film for preventing a short circuit between the lower electrode 33 and the third-layer wiring 37 and the step of etching the said insulating film to expose the surface of the upper electrode 36 become unnecessary according to the above structure of the capacitor (C).

Although in this embodiment there are adopted three wiring layers (the first-layer wiring 19, second-layer wiring 26, and third-layer wiring 37), it goes without saying that there may be adopted four or more wiring layers. Further, although in this embodiment the top-layer wiring (the third-layer wiring 37) is constituted by an Al alloy film, it may be constituted by a Cu film like the first-layer wiring 19 and the second-layer wiring 26.

Figure 13:
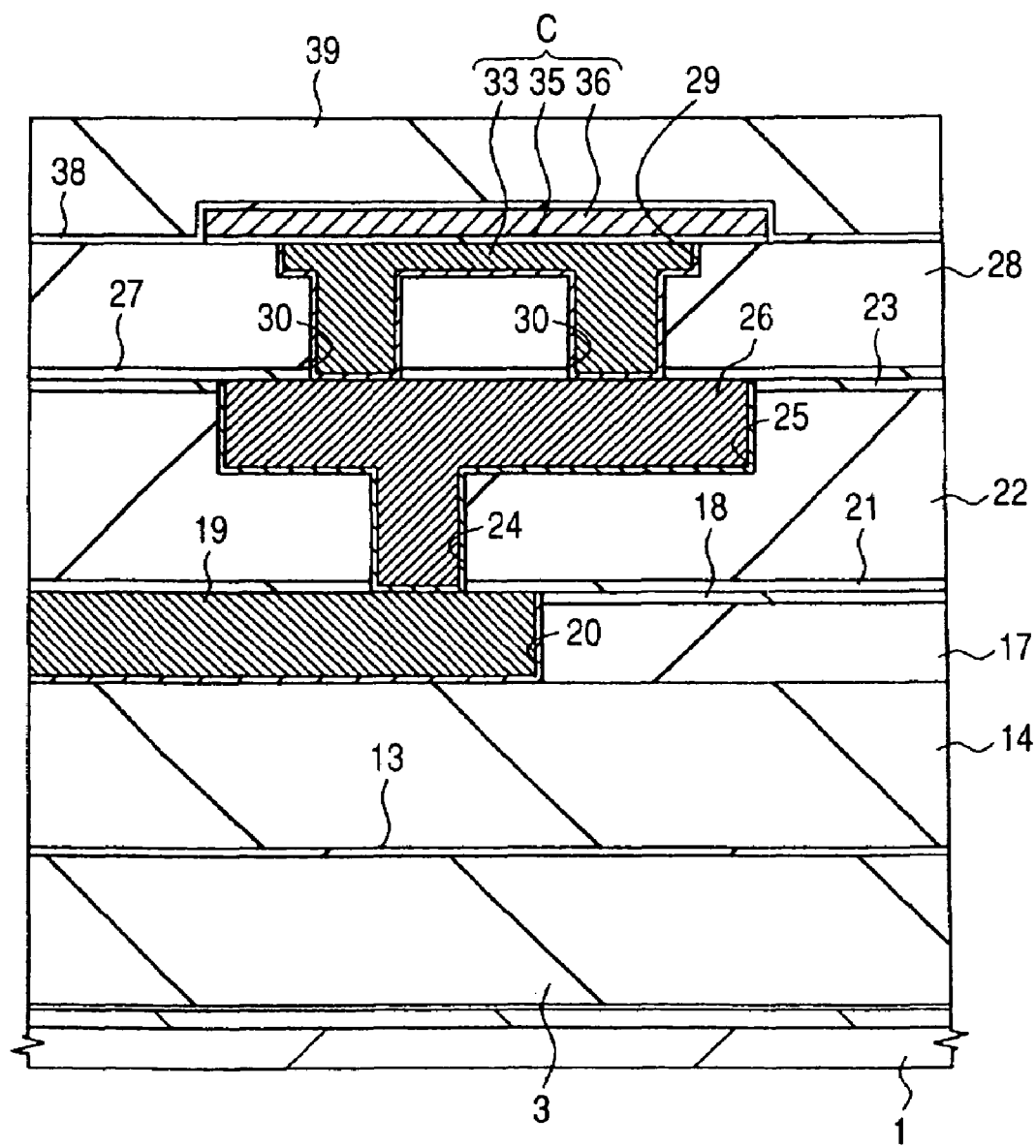
FIG. 13 is a sectional view of principal portions of a semiconductor substrate, showing a semiconductor device manufacturing method according to another embodiment of the present invention.

In the case of constituting the top-layer wiring (the third-layer wiring 37) by a Cu film, an insulating film 38 as an etching stopper and an interlayer insulating film 39 are deposited on the upper electrode 36 after formation of the capacitor (C), as shown in FIG. 13. The insulating film 38 is constituted, for example, by a silicon nitride film or silicon carbonitride (SiCN) film deposited by CVD or a silicon oxide film deposited by CVD.

Figure 14:
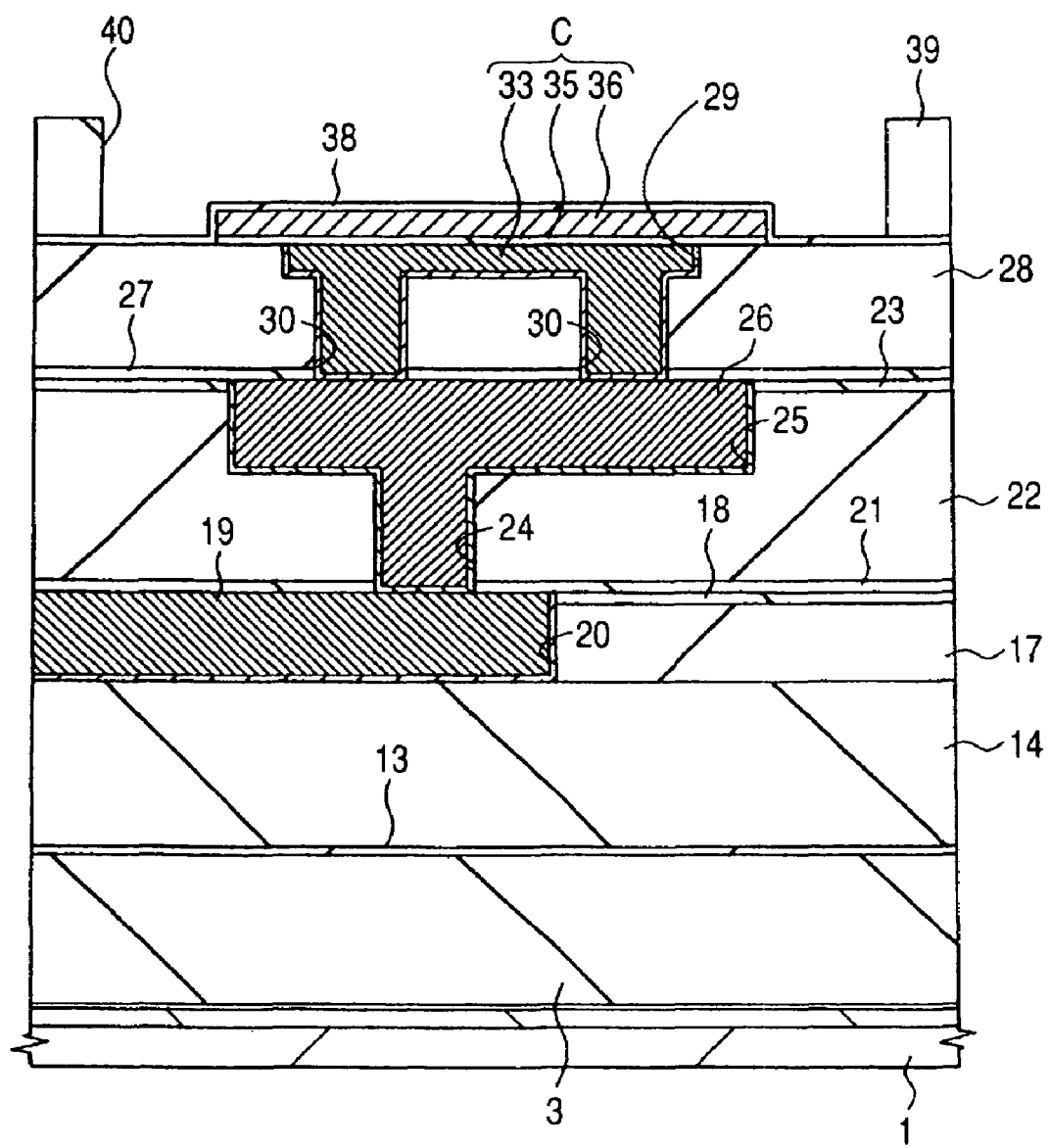
FIG. 14 is a sectional view of principal portions of the semiconductor substrate, showing a semiconductor device manufacturing step which follows FIG. 13.

Next, as shown in FIG. 14, the interlayer insulating film 39 present on top of the capacitor (C) is dry-etched using a photoresist film as a mask to form a wiring trench 40. In this dry etching process, the insulating film 38 is utilized as an etching stopper for preventing the upper electrode 36 and the underlying interlayer insulating film 28 from being etched.

Figure 15:
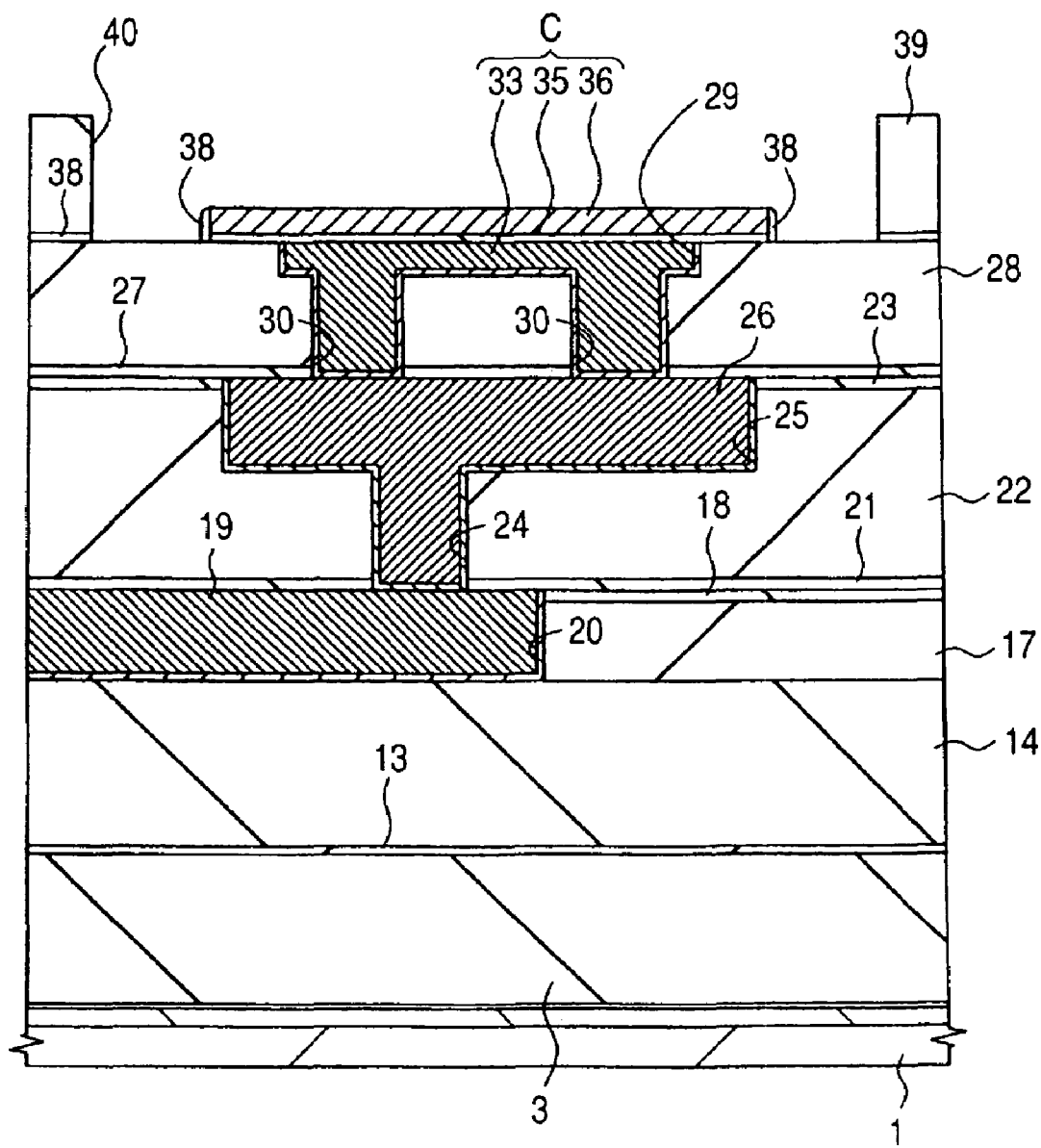
FIG. 15 is a sectional view of principal portions of the semiconductor substrate, showing a semiconductor device manufacturing step which follows FIG. 14.

Then, as shown in FIG. 15, the insulating film 38 present at the bottom of the wiring trench 40 is removed by dry etching. At this time, even if a residue of the insulating film 38 remains on side walls of the upper electrode 38 and the dielectric film 35 in the capacitor (C), there arises no problem.

Figure 16:
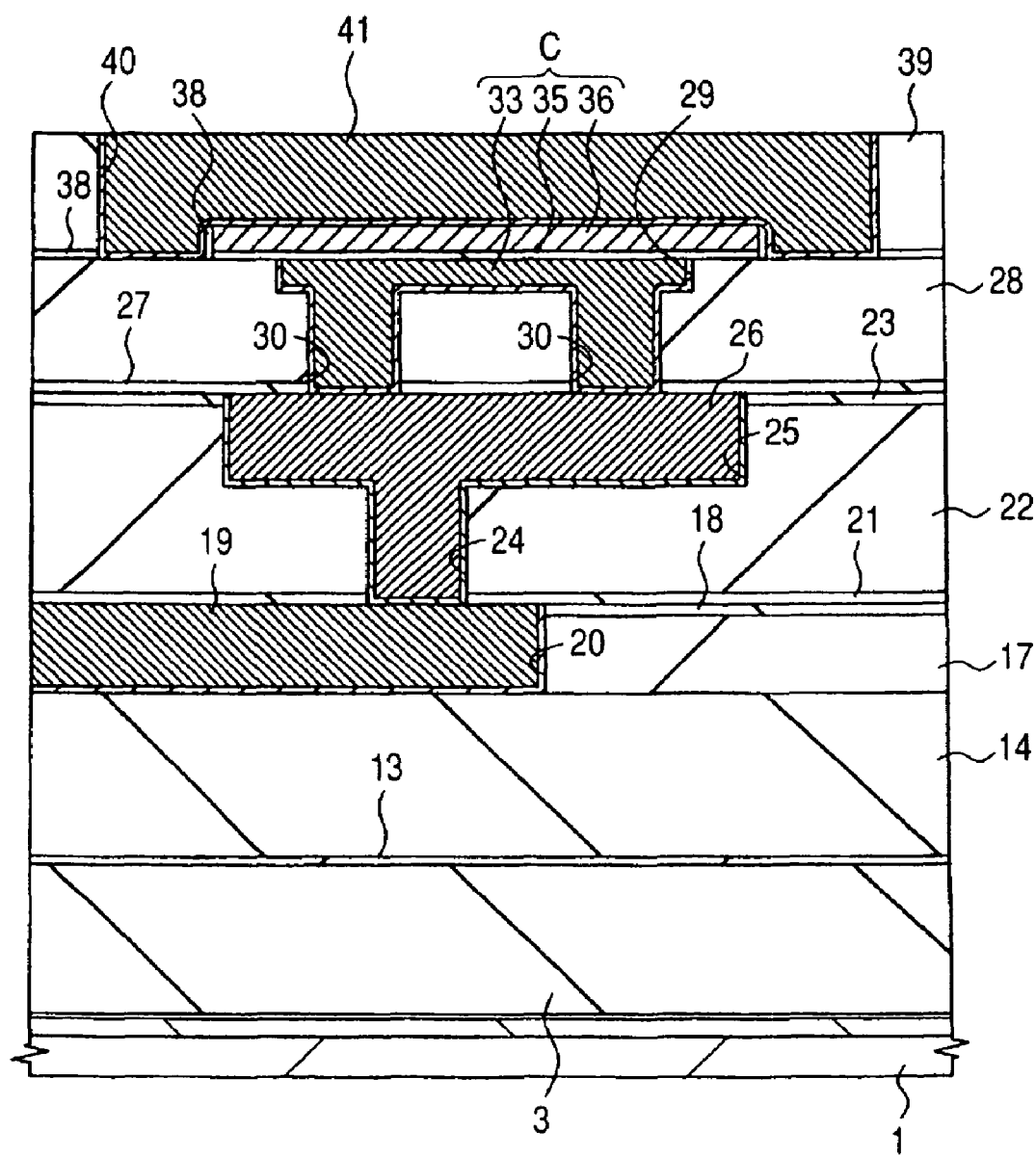
FIG. 16 is a sectional view of principal portions of the semiconductor substrate, showing a semiconductor device manufacturing step which follows FIG. 15.

Next, as shown in FIG. 16, a third-layer wiring 41 constituted by a Cu film is formed in the interior of the wiring trench 40. For forming the third-layer wiring 41, a thin TiN film is deposited in the interior of the wiring trench 40 by sputtering, then a Cu film thick enough to completely fill up the interior of the wiring trench 40 is deposited by sputtering, and thereafter the Cu film and TiN film present outside the wiring trench 40 are removed by chemical mechanical polishing.

Thus, according to this embodiment, since it is possible to positively prevent the occurrence of a short circuit between the upper electrode 36 and the lower electrode 33 in the capacitor (C), it is possible to improve the reliability and production yield of CMOS-LSI having the capacitor (C) of MIM structure.

Although the present invention has been described above concretely on the basis of embodiments thereof, it goes without saying that the present invention is not limited to the above embodiments, but that various changes may be made within the scope not departing from the gist of the invention.

Figure 17:
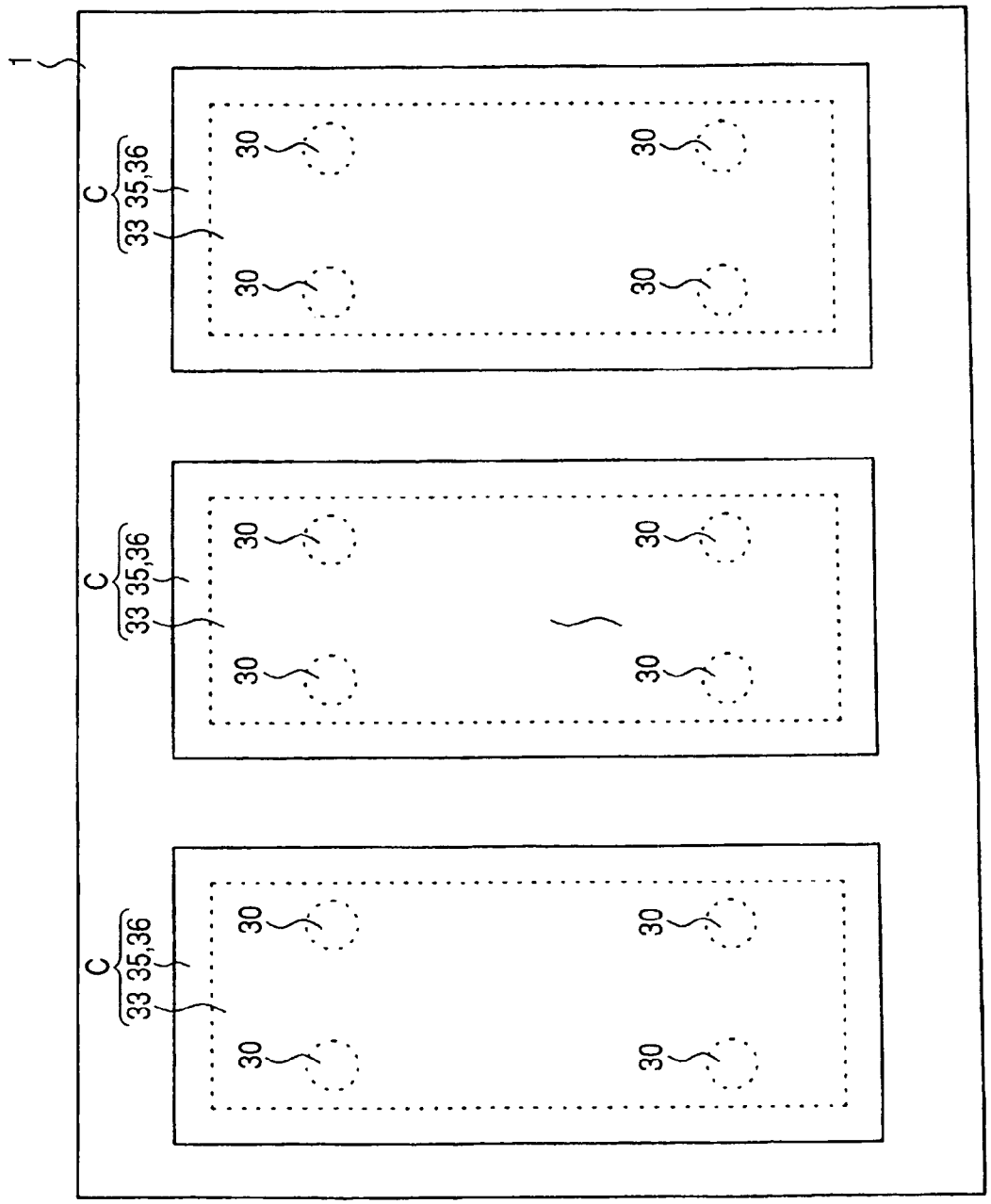
FIG. 17 is a plan view of principal portions, showing another example of planar patterns of capacitors formed on the semiconductor substrate.
Figure 18:
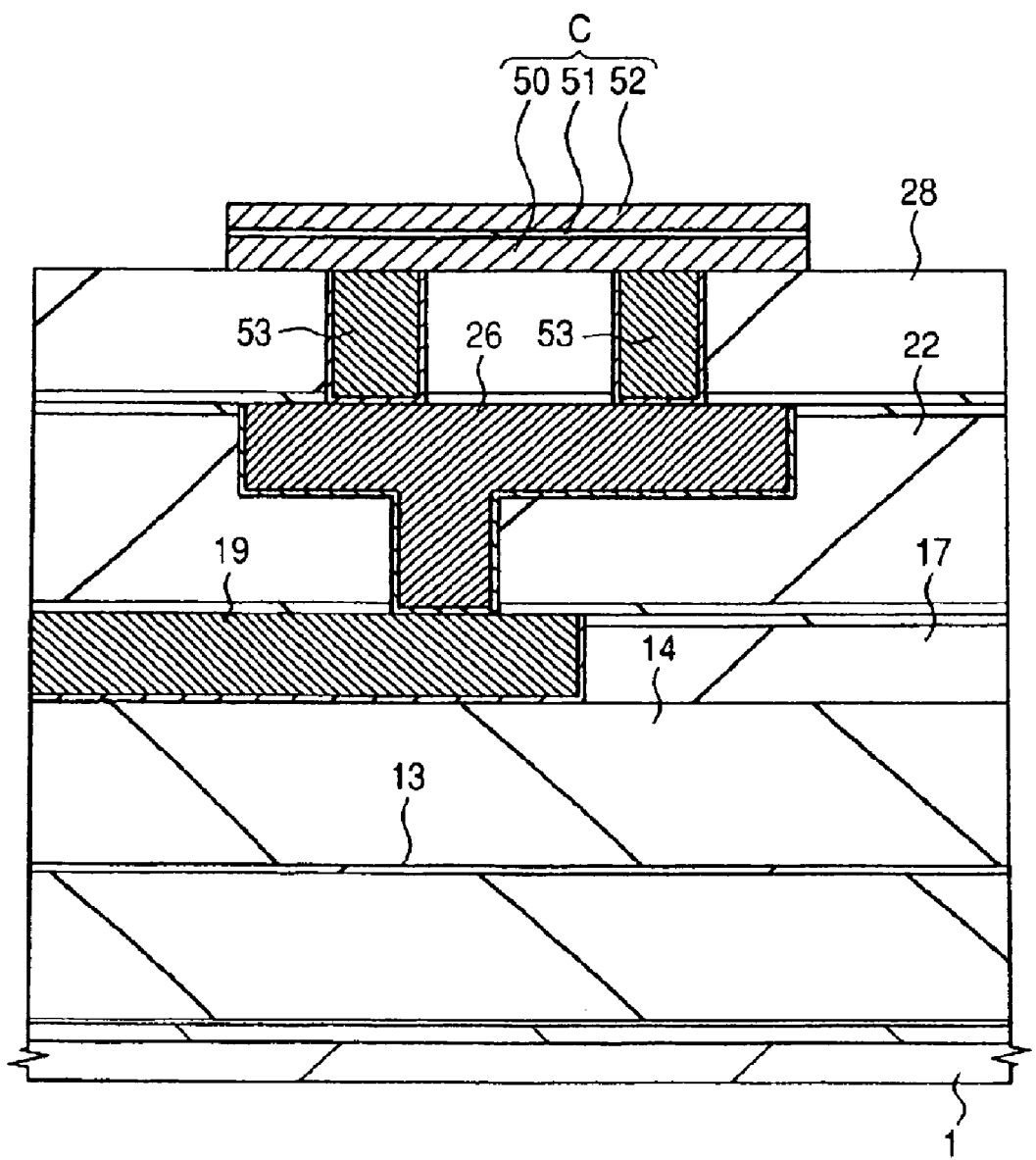
FIG. 18 is a sectional view of principal portions of the semiconductor substrate, showing a capacitor of MIM structure which the present inventors have studied.

Although in the above embodiments, the capacitor (C) has a square shape in plan, the upper electrode 36, dielectric film 35, and lower electrode 33 may each be formed in a rectangular shape in plan as shown, for example, in FIG. 17. Also in this case, the area of the upper electrode 36 and that of the dielectric film 35 are each made larger than the area of the lower electrode 33 and the whole of the lower electrode 33 is disposed inside the upper electrode 36 and dielectric film 35. It is preferable that the size of the lower electrode 33 be optimized lest the erosion phenomenon and variations in capacitance value should become marked.

The present invention is effectively applicable to a semiconductor device having a capacitor (C) of MIM structure.

What is claimed is:

1. A method of manufacturing a semiconductor device including a capacitor, the capacitor comprising a first electrode, a dielectric film formed over the first electrode, and a second electrode formed over the dielectric film, the method comprising the steps of:
    (a) forming a plurality of lower wiring layers over a semiconductor substrate;
    (b) forming an insulating film over the lower wiring layers;
    (c) forming a first via hole and a second via hole in the insulating film;
    (d) forming an electrode trench larger in planar area than the second via hole in the insulating film so that the electrode trench is connected to the second via hole;
    (e) forming a first conductive film over the insulating film including an interior of the electrode trench, the first via hole, and the second via hole;
    (f) removing the first conductive film present outside the electrode trench using a chemical mechanical polishing method, allowing the first conductive film to remain in the interior of the electrode trench, the first via hole, and the second via hole, to form the first electrode in the interior of the electrode trench and the second via hole, and to form the first plug in an interior of the first via hole;
    (g) forming the dielectric film over the insulating film including an upper portion of the first electrode and forming a second conductive film over the dielectric film;
    (h) dry-etching the second conductive film and the dielectric film at the same time with use of a photoresist film as a mask, thereby allowing the dielectric film having an area larger than that of the first electrode to remain over the first electrode, and forming the second electrode over the dielectric film, wherein the second electrode comprises the second conductive film and has an area larger than that of the first electrode;
    (i) removing the photoresist film; and
    (j) forming a plurality of upper wiring layers over the insulating film, the first plug, and the second electrode, wherein one of the upper wiring layers is connected to the first plug, and wherein the other of the upper wiring layers is connected to the second electrode.

2. A method of manufacturing a semiconductor device according to claim 1,
    wherein a planar area of the first electrode is 1 to 25 $\mu m^2$.

3. A method of manufacturing a semiconductor device according to claim 1,
    wherein a planar area of the first electrode is 4 to 16 $\mu m^2$.

4. A method of manufacturing a semiconductor device according to claim 1,
    wherein the lower wiring layers and the first conductive film each comprises a metallic film containing copper as a main component and the upper wiring layers each comprises a metallic film containing an aluminum alloy as a main component.

5. A method of manufacturing a semiconductor device according to claim 1,
    wherein the lower wiring layers, the first conductive film and the upper wiring layers each comprises a metallic film containing copper as a main component.

6. A method of manufacturing a semiconductor device according to claim 1,
    wherein the first conductive film comprises a tungsten film.

7. A method of manufacturing a semiconductor device according to claim 1,
    wherein the second conductive film comprises a tungsten film, a TiN film, or a TaN film.

8. A method of manufacturing a semiconductor device according to claim 1,
    wherein the dielectric film is formed of a silicon nitride film or a silicon oxide film.

9. A method of manufacturing a semiconductor device according to claim 1,
    wherein the dielectric film is formed of a film having a higher dielectric constant than a silicon nitride film.

10. A method of manufacturing a semiconductor device according to claim 1,
    wherein the dielectric film is formed of Ta2O5.

11. A method of manufacturing a semiconductor device according to claim 1,
    wherein the upper wiring layers comprise a top wiring layer.

* * * * *